United States Patent
Wanke

(10) Patent No.: US 9,391,420 B2
(45) Date of Patent: Jul. 12, 2016

(54) MONOLITHICALLY INTEGRATED ABSOLUTE FREQUENCY COMB LASER SYSTEM

(71) Applicant: Sandia Corporation, Albuquerque, NM (US)

(72) Inventor: Michael C. Wanke, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/859,706

(22) Filed: Sep. 21, 2015

(65) Prior Publication Data

US 2016/0087395 A1    Mar. 24, 2016

Related U.S. Application Data

(60) Provisional application No. 62/053,318, filed on Sep. 22, 2014.

(51) Int. Cl.
| | |
|---|---|
| H01S 3/10 | (2006.01) |
| H01S 3/08 | (2006.01) |
| H01S 3/109 | (2006.01) |
| H01S 5/34 | (2006.01) |
| H01S 5/026 | (2006.01) |
| H01S 5/062 | (2006.01) |

(52) U.S. Cl.
CPC ......... *H01S 3/08027* (2013.01); *H01S 3/08036* (2013.01); *H01S 3/109* (2013.01); *H01S 5/026* (2013.01); *H01S 5/0623* (2013.01); *H01S 5/3401* (2013.01)

(58) Field of Classification Search
CPC . H01S 3/109; H01S 3/08027; H01S 3/08036; H01S 5/3401; H01S 5/026
USPC .................................................. 372/22, 20, 23
See application file for complete search history.

(56) References Cited

U.S. PATENT DOCUMENTS

| | | | | |
|---|---|---|---|---|
| 6,845,108 | B1* | 1/2005 | Liu | H01S 3/1109 372/20 |
| 8,780,948 | B2* | 7/2014 | Wilkinson | H01S 3/1303 372/18 |
| 2009/0256638 | A1* | 10/2009 | Rosenbluh | G04F 5/145 331/3 |
| 2010/0046003 | A1* | 2/2010 | Le Floch | G01J 3/10 356/486 |
| 2011/0051763 | A1* | 3/2011 | Vanier | G04F 5/145 372/38.02 |

* cited by examiner

*Primary Examiner* — Kinam Park
(74) *Attorney, Agent, or Firm* — Kevin W. Bieg

(57) ABSTRACT

Rather than down-convert optical frequencies, a QCL laser system directly generates a THz frequency comb in a compact monolithically integrated chip that can be locked to an absolute frequency without the need of a frequency-comb synthesizer. The monolithic, absolute frequency comb can provide a THz frequency reference and tool for high-resolution broad band spectroscopy.

6 Claims, 3 Drawing Sheets

MONOLITHICALLY INTEGRATED ABSOLUTE FREQUENCY COMB LASER SYSTEM

CROSS-REFERENCE TO RELATED APPLICATION

This application claims the benefit of U.S. Provisional Application No. 62/053,348, filed Sep. 22, 2014, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to laser frequency combs and, in particular, to monolithically integrated absolute frequency comb laser system that can operate in the terahertz spectral region.

BACKGROUND OF THE INVENTION

FIG. 1 is a schematic illustration of the basic method of generating frequency combs such that the absolute frequency of each comb line is known. The method uses a laser emitting at many modes equally spaced, with a spacing of $\Delta f$ (i.e., row A in FIG. 1). Assume the lowest frequency mode is at $f0$ and the highest frequency mode $fnmax > 2*f0$ (i.e., greater than an octave in frequency). In general, $f0$ will not be an exact integer multiple of $\Delta f$, but $f0$ can be expressed as an integer multiple of $\Delta f$ plus some offset frequency, $\delta$. Therefore, $f0 = (p*\Delta f + \delta)$. The frequencies of each of the laser modes can be defined as $fn = f0 + n*\Delta f = (p*\Delta f + \delta) + n*\Delta f$, where n and p are integers and $\delta$ is the offset frequency between the laser modes and a comb of frequencies defined by $m*\Delta f$, where m is an integer.

Many existing and proposed applications in the terahertz regime (e.g., 0.1-10 THz), such as astrophysics, high-resolution molecular spectroscopy, plasma diagnostics and manipulation of cold molecules, require very precise knowledge of the signal frequencies. Existing systems to generate absolute frequency combs use external non-linear elements to create harmonics or difference frequencies and then mix the created frequencies on a separate detector fast enough to see the offset between the laser modes and the comb separation. Recent developments in frequency combs have provided frequency measurement precision with one hertz (Hz) resolution over nearly all frequencies. However, systems to create absolute frequency combs are typically quite large and in the terahertz (THz) the comb is generated by inefficient down-conversion from optical frequency combs.

SUMMARY OF THE INVENTION

The present invention is directed to a monolithic, absolute frequency comb in the THz to provide a THz frequency reference and tool for high-resolution broad band spectroscopy. Rather than down-convert optical frequencies, the laser system of the present invention directly generates a THz frequency comb in a compact monolithically integrated chip that can be locked to an absolute frequency without the need of a frequency-comb synthesizer. A broad gain THz quantum cascade laser (QCL) is used to generate a comb of emission lines. Using the difference signal generated by multiple laser modes mixing in a monolithically integrated detector, the frequency separation between the modes can be locked to 1 Hz resolution, thereby providing evenly spaced "tick marks" on a frequency ruler. Analogous to optical frequency combs, by expanding the laser bandwidth to more than an octave, generating harmonics, and by mixing more modes $\delta$ can be precisely set and the tick marks can be precisely "located" on the ruler to provide absolute frequency calibration.

The present invention combines these elements into a single compact device, wherein an embedded diode, or a non-linear element that senses the internal laser fields, can create the harmonics and the difference frequencies and also mix these products against the original lines simultaneously. This minimizes optical components, eliminates alignment and feedback issues, and greatly reduces size. In addition, the optical fields inside the laser are much stronger than any fields emitted by the laser which improves generation of the mixed signals since they are generated by non-linear processes which improve in efficiency as the power increases. Finally, integrating the required broad gain QCL, second harmonic generator, and frequency mixer elements onto a single small chip can expand the potential application space for THz frequency combs by significantly reducing size, weight and complexity of existing systems.

BRIEF DESCRIPTION OF THE DRAWINGS

The detailed description will refer to the following drawings, wherein like elements are referred to by like numbers.

DETAILED DESCRIPTION OF THE INVENTION

A frequency comb comprises a light source whose spectrum consists of a series of discrete, equally spaced spectral lines. Frequency combs are typically generated by means of a mode-locked laser, whereby a fixed phase relationship is induced between the longitudinal modes of the laser's resonant cavity, thereby stabilizing the pulse train generated by the laser. Each time a pulse circulating in the laser cavity reaches the output coupler, a fraction of its energy is coupled out of the laser. The emitted pulse therefore has a precisely periodic envelope function with a repetition frequency equal to the inverse round-trip transit time of the pulse in the laser cavity.

The present invention uses a laser with a broad bandwidth such that it lases on modes simultaneously spanning more than 1 octave of frequency space (i.e., the highest frequency emitted is larger than twice the lowest frequency). The invention can use a quantum cascade laser in a Fabry-Perot cavity that emits many Fabry-Perot modes simultaneously with a uniform mode spacing. Due to waveguide dispersion (which is high in THz waveguides), the free-running mode spacing will not necessarily be constant across the whole span. However, equal mode spacing can be forced by driving the laser bias at a frequency corresponding to the frequency separation between the Fabry-Perot modes or by locking the beat frequency between the modes with a much slower proportional-integral-derivative (PID) control loop controlling the laser current. See S. Barbieri et al., *Nature Photonics* 4, 636 (2010); A. Baryshev et al., *Appl. Phys. Lett.* 89, 031115 (2006); and M. C. Wanke et al., *Optics Express* 19, 24810 (2011). It is possible that self-mixing in the laser may passively create equal mode spacings for certain laser parameters, but this is less understood and may be unstable. See Hugi et al., *Nature* 492, 229 (2012). Therefore, according to the present invention, the laser can be actively driven at the frequency separation of the modes to ensure uniform mode separation (difference frequency, $\Delta f$), so that the slower PID control can be used simultaneously to lock the absolute frequency. To ensure the spacing remains uniform over an entire octave, the waveguide can be engineered to reduce waveguide dispersion. See Burghoff et al., *Nat. Photonics* 8, 462 (2014).

Figure 2:
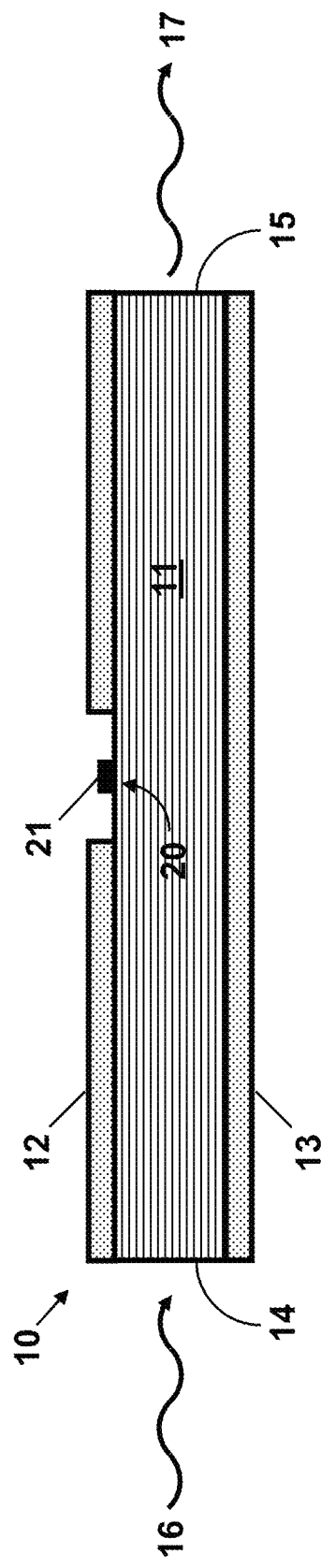
FIG. 2 is a schematic illustration of a monolithically integrated absolute frequency comb laser system.

In FIG. 2 is shown a schematic illustration of a monolithically integrated absolute frequency comb laser system that can be used to generate a frequency comb. The system integrates a terahertz QCL 10 and a Schottky diode 20 onto a single semiconductor chip platform. See U.S. Pat. No. 7,550,734 and U.S. Pat. No. 8,274,058, both of which are incorporated herein by reference. The QCL 10 comprises a layered heterostructure of two or more semiconductor alloys forming an active semiconductor core 11 between a top waveguide layer 12 and a bottom contact layer 13. The top and bottom layers 12 and 13 are typically metal or doped-semiconductor layers that keep most of the mode in a laser cavity defined by end facets 14 and 15. In particular, with terahertz QCLs the mode is confined by interaction with a surface plasmon at the core/metal interface. The waveguide layers 12 and 13 can also provide electrical contacts to the semiconductor core 11. The Schottky diode 20 can be the interface between the semiconductor core 11 and a metal 21. To make a diode, the metal 21 at this interface must be rectifying. For example, titanium makes a particularly stable Schottky contact to a GaAs-based semiconductor core. The laser field intensity inside the laser cavity is high at the metal/semiconductor interface defining the Schottky diode. The layers 12 and 13 over the rest of the semiconductor core 11 can be a different metal that preferably provides an ohmic contact to the semiconductor material, rather than a rectifying contact. Each time a pulse circulating in the laser cavity reaches an exit end facet 15, a fraction of its energy is coupled out of the laser to provide the frequency comb 17.

The difference frequencies can also be generated by mixing on other non-linear elements that sense the laser fields, such as a non-ohmic laser contact or the non-linear current-voltage relation of the laser itself. See P. Gellie et al., *Opt. Express* 18, 20799 (2010).

As described above, there are two ways to ensure $\Delta f$ is fixed across the whole span of laser frequencies. First, the QCL can be actively injection-locked by direct modulation of the bias current at the round-trip frequency. See P. Gellie, *Opt. Express* 18, 20799, (2010). Second, feedback from the Schottky diode integrated into the QCL can be used to internally phase lock the difference frequencies ($\Delta f$'s) among the Fabry-Perot longitudinal modes of the QCL. Because the internal THz fields of the QCL modes permeate the semiconductor layer making up the diode's cathode, the diode couples to and mixes the QCL fields to generate a down-converted signal at frequency $\Delta f$ (e.g., at a round-trip frequency of 10-30 GHz mode spacing). These microwave $\Delta f$ signals can be taken from a co-planar waveguide fed by the diode contact and amplified. To phase lock the difference frequency between the internal Fabry-Perot modes, the amplified microwave $\Delta f$ signal originating from the diode can be input into a microwave frequency counter with error correction. The frequency counter generates a phase error signal proportional to the difference between the $\Delta f$ input and a set point microwave frequency. The error signal can then fed back to a voltage-controlled power supply that bias the QCL. See M. C. Wanke et al., *Optics Express* 19, 24810 (2011).

Figure 3:
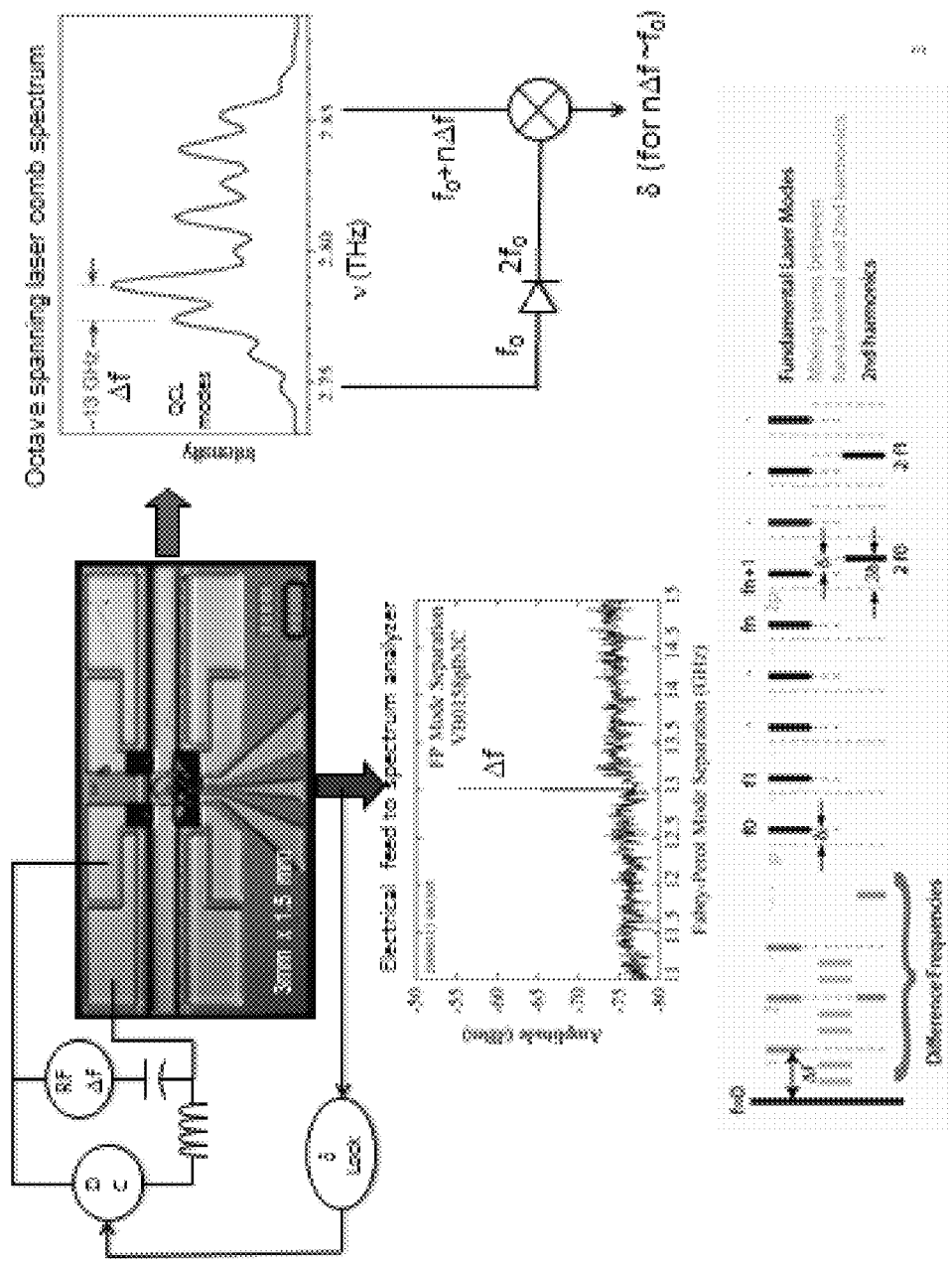
FIG. 3 is a schematic illustration of method to lock the frequency comb so that it remains fixed in time.

FIG. 3 is a schematic illustration of method to lock the frequency comb so that it remains fixed in time. The laser is driven by a DC bias in combination with a microwave source. The microwave frequency is set to equal the frequency spacing between the laser modes, $\Delta f$, which is predominantly determined by the waveguide length. The diode generates difference frequencies between the fundamental laser modes, harmonics of the laser modes, sum frequencies between laser modes and between the difference frequencies it creates and the laser modes. If the laser bandwidth spans an octave, this mixing can generate an electronic signal at the frequency $\delta$. As described above, knowing $\delta$ and $\Delta f$, the absolute frequency of the comb lines is known. The beat frequency at $\delta$ can be input into a microwave frequency counter so that any deviation from the desired value will lead to an error correction signal which can be fed back to the DC bias of the laser to stabilize $\delta$.

Figure 1:
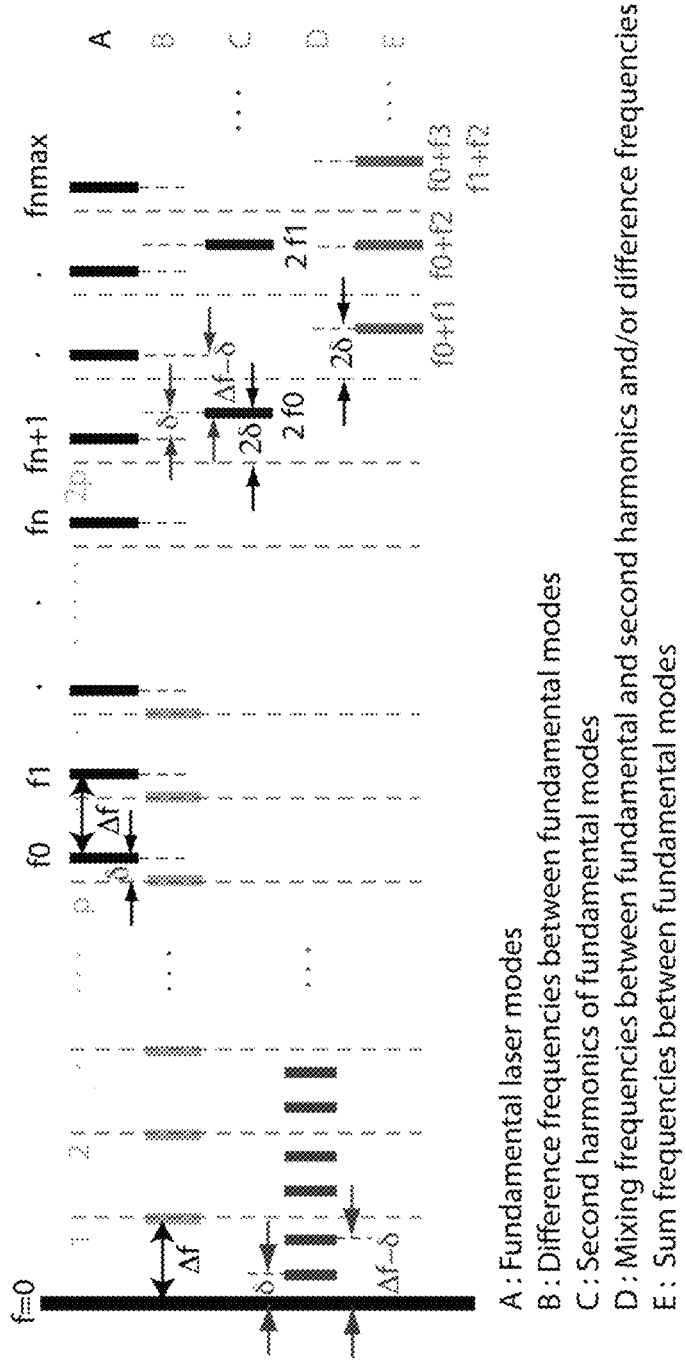
FIG. 1 is a schematic illustration of all the frequencies generated by the laser and mixer, how $\Delta f$ and $\delta$ relate to the laser modes, and how the absolute frequency of a broadband frequency comb is determined by $\Delta f$ and $\delta$.

Besides generating a signal at $\Delta f$, corresponding to frequency difference of nearest neighbor laser modes, the non-linear response of the diode will mix any frequencies it is driven by including the non-nearest neighbor laser modes, harmonics, and sum frequencies. For a 3 mm long QCL, $\Delta f \sim 10$ GHz, and a comb of difference frequencies will be generated by the diode with frequencies $fm=m*\Delta f$, where m is an integer less than or equal to nmax (i.e., row B in FIG. 1). The lower frequencies of this difference frequency comb can be measured using microwave electronics. This comb of difference frequencies generated by the actual laser lines will span from $f1-f0=\Delta f$ to $fnmax-f0=nmax*\Delta f$. If $fnmax>2*f0$, then the highest difference frequency will be higher than f0, and the difference frequency will beat against the fundamental modes to generate additional frequencies at $\delta+n*\Delta f$, and $n*\Delta f-\delta$ (i.e., row D in FIG. 1). If the comb frequency separation $\Delta f$ and the frequency $\delta$ are simultaneously locked, then the frequency of every comb tooth is precisely determined with an error of $\epsilon(\delta)+(n+p)\epsilon(\Delta f)$, where $\epsilon(.)$ stands for the measurement error or uncertainty of the variable in parentheses. Here, the direct laser current modulation technique can be used to control $\Delta f$ and the PID feedback loop can be used to independently control $\delta$.

The same diode in the laser can generate the second harmonic and the sum frequencies of the fundamental laser modes (it is also possible to generate the second harmonics in the laser itself). As depicted in rows C and E of FIG. 1, both of these sets of frequencies will be offset from the fundamental laser lines by an amount equal at $\delta+n*\Delta f$ for fundamental lines below a frequency in these sets and $n*\Delta f-\delta$ for laser modes higher than a frequency in these two sets. These are the exact same frequencies generated by mixing the difference frequencies against the fundamental frequencies (i.e., row D in FIG. 1). Whether the signal having frequency $\delta$ is generated by mixing of harmonics or sum frequency terms against the fundamental laser terms or whether it is generated by the difference frequencies generated by the diode mixing against the fundamental laser modes, the comb can be still locked to an absolute frequency as described above. In reality, some combination of all these various mixing terms will occur, and it will not be possible to tell how much of each frequency comes from which term, but it does not make a difference to the lock since independent of the mixing mechanism, the same frequencies are generated.

As mentioned above, two mechanisms have been demonstrated to lock $\Delta f$ in a THz QCL—injecting RF power into the laser bias at a frequency of the laser mode separation or using a PID loop to lock the laser mode separation against a reference frequency. To lock both $\Delta f$ and $\delta$ simultaneously, RF power can be injected into the laser bias to lock $\Delta f$, and then the average DC laser current can be controlled with a PID loop to lock $\delta$ to an available stabilized electronic reference frequency. Measurements on THz QCLs with integrated diodes have already demonstrated that $\Delta f$ and $\delta$ can be controlled independently without impacting the other, which makes locking the two frequencies independently much easier. See M. C. Wanke et al., *Optics Express* 19, 24810 (2011); and M. C. Wanke et al., *Nature Photonics* 4, 565 (2010).

Note that while the ideal situation as described above requires an octave spanning laser spectrum, it is not actually required to have an octave spanning spectrum—it just makes things easier. If, for example, fnmax=f0+(f0−$\delta$)/2, then the maximum difference frequencies between laser modes generated will be at $f_{1/2}$=fnmax−f0=(f0−$\delta$)/2. This frequency in the diode can then mix against f0 to generate another mixer frequency at $f_{1/2+}$=f0−(f0−$\delta$)/2=(f0+$\delta$)/2. These two frequencies can mix to generate $f_{1/2+}$−$f_{1/2-}$=$\delta$. The diode may also produce the second harmonic of $f_{1/2-}$ in the diode. This second harmonic occurs at f0−$\delta$, and if this mixes with f0 will produce a response at the frequency $\delta$. Therefore, again a frequency at $\delta$ will be generated and can be used to lock the absolute laser frequency. Both of these processes require $3^{rd}$ order or higher mixing products, where the order of mixing refers to how many times mixing needs to occur to get a mixing product at $\delta$. As the order increases the strength of the signal decreases which will require higher initial power in the relevant laser modes to ensure the generated power at frequency $\delta$ remains above the noise floor. If sufficient power exists in the laser modes, to drive higher order harmonics up to harmonic r of the generated beat frequencies of the fundamental laser modes, the span required is reduced to f0/r.

If the harmonic generation or mixing by the diode generates signals that are too small to use for locking the laser, it is also possible to use external components to optimize harmonic or mixing signal generation and re-inject the signals generated into the laser itself or into the diode. Mixing between externally generated signals injected into the laser and the fundamental laser modes has already been demonstrated. See M. C. Wanke et al., *Optics Express* 19, 24810 (2011). Thus a second harmonic of the laser modes can be generated by a non-linear crystal and re-injected into the laser, or some integer multiple of the microwave difference frequency $\Delta f$ can be amplified, harmonically multiplied up to the fundamental laser frequency and re-injected into the laser. See J. C. Pearson et al., *Rev. Sci. Instrum.* 82, 093105, (2011). This can increase the system size and complexity but may significantly enhance the mixing signals. While the discussion above focused mostly on THz quantum cascade lasers, the same principles apply to MIR quantum cascade lasers as well.

The present invention has been described as a monolithically integrated absolute frequency comb laser system. It will be understood that the above description is merely illustrative of the applications of the principles of the present invention, the scope of which is to be determined by the claims viewed in light of the specification. Other variants and modifications of the invention will be apparent to those of skill in the art.

I claim:

1. A monolithically integrated absolute frequency comb source, comprising:
   a Fabry-Perot laser emitting light at many equally spaced modes;
   an integrated mixing element that generates sum, difference, and harmonic frequencies of the laser modes; and
   a microwave frequency counter that uses the signals generated by the mixer to lock the absolute frequency of the comb of laser lines.

2. The monolithically integrated absolute frequency comb source of claim 1, wherein the laser comprises a THz quantum cascade laser.

3. The monolithically integrated absolute frequency comb source of claim 1, wherein the laser comprises a MIR quantum cascade laser.

4. The monolithically integrated absolute frequency comb source of claim 1, wherein the integrated mixing element comprises a Schottky diode.

5. The monolithically integrated absolute frequency comb source of claim 1, wherein the integrated mixing element comprises the non-linear current-voltage of the laser.

6. The monolithically integrated absolute frequency comb source of claim 1, wherein the integrated mixing element comprises the non-linear current-voltage of a metal contact through which the laser current flows.

* * * * *